United States Patent
He et al.

(10) Patent No.: US 11,790,980 B2
(45) Date of Patent: Oct. 17, 2023

(54) DRIVER SHARING BETWEEN BANKS OR PORTIONS OF BANKS OF MEMORY DEVICES

(71) Applicant: Micron Technology, Inc., Boise, ID (US)

(72) Inventors: Yuan He, Boise, ID (US); George B. Raad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 120 days.

(21) Appl. No.: 17/407,822

(22) Filed: Aug. 20, 2021

(65) Prior Publication Data

US 2023/0059803 A1   Feb. 23, 2023

(51) Int. Cl.
*G11C 8/00* (2006.01)
*G11C 11/408* (2006.01)
*G11C 11/22* (2006.01)

(52) U.S. Cl.
CPC ...... *G11C 11/4085* (2013.01); *G11C 11/2257* (2013.01)

(58) Field of Classification Search
CPC ............. G11C 11/4085; G11C 11/2257
USPC ........................................................ 365/149
See application file for complete search history.

(56) References Cited

U.S. PATENT DOCUMENTS

| | | | | |
|---|---|---|---|---|
| 6,426,914 B1* | 7/2002 | Dennard | ............. | G11C 11/4085 365/230.06 |
| 6,538,932 B2* | 3/2003 | Ellis | ............. | G11C 7/22 365/194 |
| 7,170,808 B2* | 1/2007 | Hokenmaier | ......... | G11C 11/406 365/230.03 |
| 7,266,032 B2* | 9/2007 | Suh | ............. | G11C 11/40618 365/150 |
| 7,639,066 B2* | 12/2009 | Harald | ............. | G11C 11/4085 327/112 |
| 8,799,566 B2* | 8/2014 | Kilmer | ............. | G11C 11/406 365/222 |
| 8,958,244 B2* | 2/2015 | Rhie | ............. | G11C 16/08 365/185.11 |
| 9,432,298 B1* | 8/2016 | Smith | ............. | H04L 49/9057 |
| 9,601,183 B1* | 3/2017 | Kajigaya | ............. | G11C 11/4076 |
| 2015/0243346 A1* | 8/2015 | Ohata | ............. | G11C 11/4074 365/230.06 |

* cited by examiner

*Primary Examiner* — Viet Q Nguyen
(74) *Attorney, Agent, or Firm* — Holland & Hart LLP

(57) ABSTRACT

Methods, systems, and devices for driver sharing between banks or portions of banks of memory devices are described. An apparatus may include a first bank and a second bank of memory cells and a word line driver configured to activate word lines. The word line driver may include a master word line driver and an address driver. In some examples, the master word line driver may be configured to generate a first signal to a first portion of the first bank or a second portion of the first bank as part of performing an access operation. In some examples, the master word line driver may be configured to generate a first signal for the first bank or the second bank as part of performing an access operation. The address driver configured to generate a second signal to a portion of the first bank or the second bank.

20 Claims, 9 Drawing Sheets

Bank 305   Master Word Line Driver 315   Address Driver 320

Bank Logic 325

DRIVER SHARING BETWEEN BANKS OR PORTIONS OF BANKS OF MEMORY DEVICES

FIELD OF TECHNOLOGY

The following relates generally to one or more systems for memory and more specifically to driver sharing between banks or portions of banks of memory devices.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state if disconnected from an external power source.

DETAILED DESCRIPTION

Figure 1:
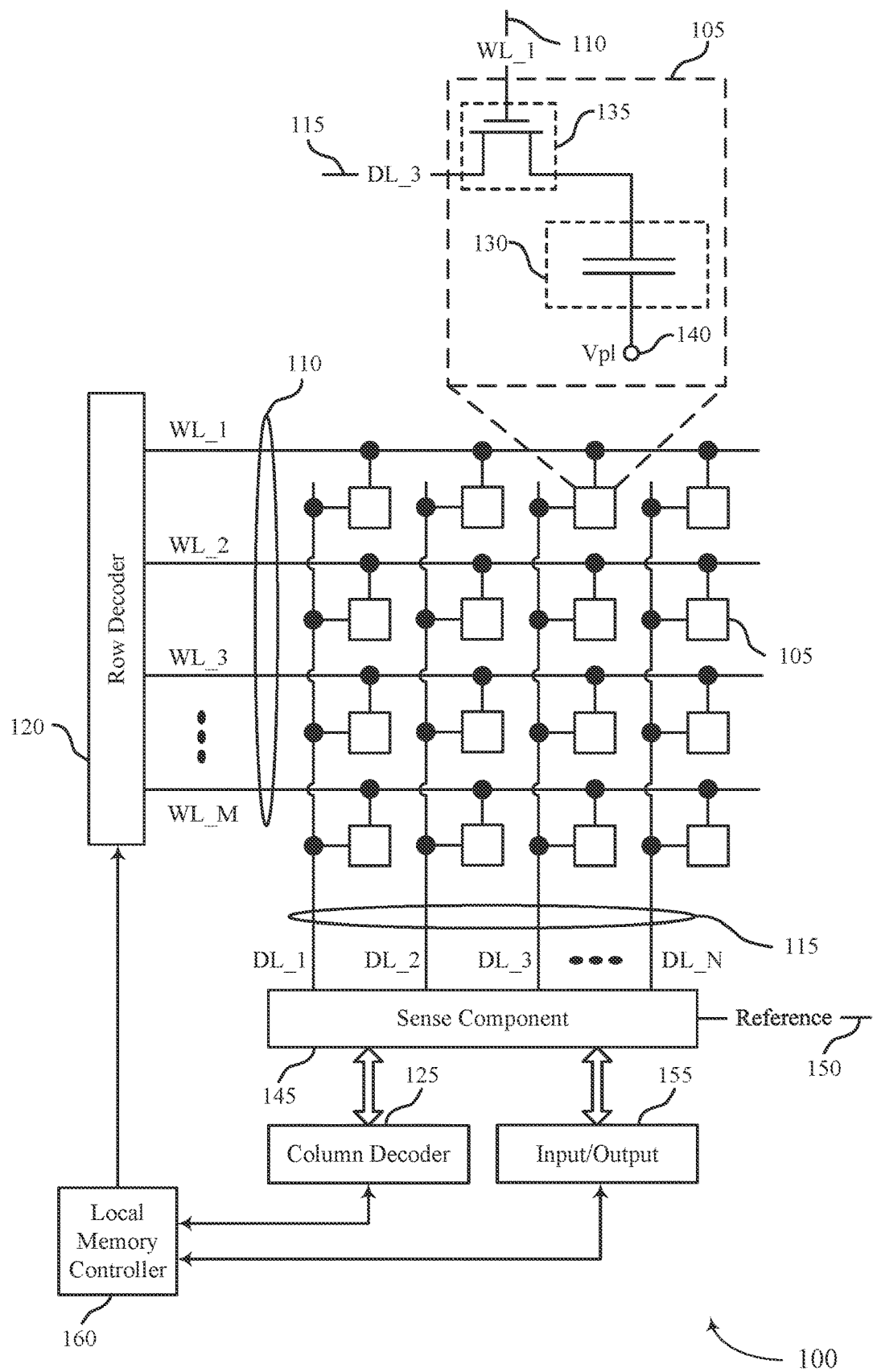
FIG. 1 illustrates an example of a memory die that supports driver sharing between banks or portions of banks of memory devices in accordance with examples as disclosed herein.

A memory device may perform an access operation to access (e.g., read or write) one or more rows of memory cells of a memory array. The memory array of the memory device may be divided into multiple different banks of memory cells, where each bank may be accessed independent from one another. In some examples, just a portion of a bank may be accessed at one time. The memory device may include drivers and other circuitry configured to access the banks of memory cells. The function of these drivers may be to drive or route signals to components of the banks of memory cells. An example of one of these drivers may be a word line driver configured to active word lines of the memory device.

The word line driver may include an address driver and a master word line driver. In one example, the memory device may receive a command from a host device to access memory cells of a portion of a bank. Upon receiving the command, the word line driver may be configured to active a target word line indicated by the command. To accomplish activating the target word line, the master word line driver may bias a master word line corresponding to the whole bank to a first voltage and the address driver may bias an address line of the portion of the bank to a second voltage, where the first voltage may be less than the second voltage. The biasing of the main word line in combination with the biasing of the address line may activate the target word line indicated in the command and allow for memory device to access the memory cells of the portion of the bank. To support the operations as described above, the word line driver may include one master word line driver for the bank and separate address line drivers for each portion of the bank. Circuitry to support multiple address line drivers at one bank may be substantial and, in some examples, may increase the overall size of the memory device when compared with other architectures.

Portions of the bank or different banks of the memory device may share components of the word line driver in an effort to reduce the overall size of the word line driver of the memory device. In some examples, the master word line driver may be configured to generate a signal for different portions of the same bank. In some examples, the master line driver may be configured to generate a single for different banks.

The master word line driver may include a pre-stage driver and final stage driver. The pre-stage driver may route control signals output from bank logic circuitry to the final stage driver and the final stage driver may activate the master main word line based on the control signaling. In other memory device architectures, each bank may have a single pre-stage driver corresponding to the master word line driver and a single final stage driver corresponding to the master word line driver.

Techniques, devices, and systems that include the memory device architecture as described herein allows for the sharing of the master word line driver between different portions of a bank. For example, the main word line driver may include a single pre-stage driver for the whole bank and a final stage driver for each portion of the bank. During an access operation, the single pre-stage driver may route control signals output from bank logic circuitry to a final stage driver corresponding to the portion of the bank being accessed and the final stage driver may bias a main word line of the portion based on the control signaling.

Techniques, devices, and systems that include the memory device architecture as described herein allows for the sharing of the master word line driver between different banks of the memory device. For example, components of the main word driver may be shared between two or more banks of the memory device. In such examples, each bank of the two or more banks may have corresponding address drivers and during an access operation, the address driver may bias an address line of a portion of its respective bank being accessed. Moreover, the main word line driver may include a single pre-stage driver for at least two banks and a final stage driver for each of the two or more banks. During an access operation, the single pre-stage driver may route control signaling output from bank logic circuitry to a final stage driver corresponding to bank being accessed and the final stage driver may bias a main word line of the bank based on the control signaling. Sharing main word line driver components between portions of a bank or between different banks may decrease the size of the word line driver of the memory device when compared to other memory device architectures.

Features of the disclosure are initially described in the context of a die as described with reference to FIG. 1. Features of the disclosure are described in the context of component diagrams, memory device architectures, and circuit diagrams as described with reference to FIGS. 2-7B. These and other features of the disclosure are further illustrated by and described with reference to an apparatus diagram and a flowchart that relate to driver sharing between banks or portions of banks of memory devices as described with reference to FIGS. 8-9.

FIG. 1 illustrates an example of a memory die 100 that supports driver sharing between banks or portions of banks of memory devices in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

A memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135. The capacitor 130 may be an example of a dielectric capacitor or a ferroelectric capacitor. A node of the capacitor 130 may be coupled with a voltage source 140, which may be the cell plate reference voltage, such as Vpl, or may be ground, such as Vss.

The memory die 100 may include one or more access lines (e.g., one or more word lines 110 and one or more digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. References to access lines, row lines, column lines, word lines, digit lines, or bit lines, or their analogues, are interchangeable without loss of understanding or operation. Memory cells 105 may be positioned at intersections of the word lines 110 and the digit lines 115.

Operations such as reading and writing may be performed on the memory cells 105 by activating or selecting access lines such as one or more of a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in either a two-dimensional or three-dimensional configuration may be referred to as an address of a memory cell 105.

Accessing the memory cells 105 may be controlled through a row decoder 120 or a column decoder 125. For example, a row decoder 120 may receive a row address from the local memory controller and activate a word line 110 based on the received row address. A column decoder 125 may receive a column address from the local memory controller and may activate a digit line 115 based on the received column address. In some examples, the row decoder 120 may include a word line driver. The word line driver may activate one or more word lines 110 during an access operation (e.g., a read or write operation) and may include at least one address driver and one master word line driver.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

A word line 110 may be a conductive line in electronic communication with a memory cell 105 that is used to perform access operations on the memory cell 105. In some architectures, the word line 110 may be coupled with a gate of a switching component 135 of a memory cell 105 and may be operable to control the switching component 135 of the memory cell. In some architectures, the word line 110 may be coupled with a node of the capacitor of the memory cell 105 and the memory cell 105 may not include a switching component.

A digit line 115 may be a conductive line that connects the memory cell 105 with a sense component 145. In some architectures, the memory cell 105 may be selectively coupled with the digit line 115 during portions of an access operation. For example, the word line 110 and the switching component 135 of the memory cell 105 may be operable to couple and/or isolate the capacitor 130 of the memory cell 105 and the digit line 115. In some architectures, the memory cell 105 may be coupled with the digit line 115.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory die 100.

The local memory controller may control the accessing of memory cells 105 through the various components (e.g., row decoder 120, column decoder 125, sense component 145). In some examples, one or more of the row decoder 120, column decoder 125, and sense component 145 may be co-located with the local memory controller. The local memory controller may be operable to receive one or more of commands or data from one or more different memory controllers (e.g., an external memory controller associated with a host device, another controller associated with the memory die 100), translate the commands or the data (or both) into information that can be used by the memory die 100, perform one or more operations on the memory die 100, and communicate data from the memory die 100 to a host device based on performing the one or more operations. The local memory controller may generate row signals and column address signals to activate the target word line 110 and the target digit line 115. The local memory controller may also generate and control various voltages or currents used during the operation of the memory die 100. In general, the amplitude, the shape, or the duration of an applied voltage or current discussed herein may be varied and may be different for the various operations discussed in operating the memory die 100.

The local memory controller may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller in response to various access commands (e.g., from a host device). The local memory controller may be operable to perform other access operations not listed here or other operations related to the operating of the memory die 100 that are not directly related to accessing the memory cells 105.

The local memory controller may be operable to perform a write operation (e.g., a programming operation) on one or more memory cells 105 of the memory die 100. During a write operation, a memory cell 105 of the memory die 100 may be programmed to store a desired logic state. The local memory controller may identify a target memory cell 105 on which to perform the write operation. The local memory controller may identify a target word line 110 and a target digit line 115 coupled with the target memory cell 105 (e.g., the address of the target memory cell 105). The local memory controller may activate the target word line 110 and the target digit line 115 (e.g., applying a voltage to the word line 110 or digit line 115) to access the target memory cell 105. The local memory controller may apply a specific signal (e.g., write pulse) to the digit line 115 during the write operation to store a specific state (e.g., charge) in the capacitor 130 of the memory cell 105. The pulse used as part of the write operation may include one or more voltage levels over a duration.

The local memory controller may be operable to perform a read operation (e.g., a sense operation) on one or more memory cells 105 of the memory die 100. During a read operation, the logic state stored in a memory cell 105 of the memory die 100 may be determined. The local memory controller may identify a target memory cell 105 on which to perform the read operation. The local memory controller may identify a target word line 110 and a target digit line 115 coupled with the target memory cell 105 (e.g., the address of the target memory cell 105). The local memory controller may activate the target word line 110 and the target digit line 115 (e.g., applying a voltage to the word line 110 or digit line 115) to access the target memory cell 105. The target memory cell 105 may transfer a signal to the sense component 145 in response to biasing the access lines. The sense component 145 may amplify the signal. The local memory controller may activate the sense component 145 (e.g., latch the sense component) and thereby compare the signal received from the memory cell 105 to the reference 150. Based on that comparison, the sense component 145 may determine a logic state that is stored on the memory cell 105.

In some examples, an array of memory cells 105 may be divided into banks of memory cells 105 and each bank of memory cells 105 may include multiple different portions of memory cells 105. In some examples, the memory device may receive a command to access (e.g., read or write) one or more rows of memory cells 105 located in a portion of a bank. The row decoder 120 (e.g., the word line driver) the may include an address driver and a master word line driver. Upon receiving the command, the row decoder 120 may be configured to active a target word line indicated by the command. To accomplish activating the target word line, the master word line driver may bias a master word line associated with the bank to a first voltage and bias an address line associated with the portion the bank to a second voltage to activate the target word line corresponding to the row of memory cells 105. To support this operation, each bank may share a master word line driver and each portion of the bank may have its own address line driver.

As described herein, some of the components of the main word line driver may be shared across portions of banks or different banks. In some examples, the main word line driver and the address driver may include a pre-stage driver and a final stage driver. In one example, the pre-stage driver and the final stage driver of the address line may be shared across different portions of a bank. Consequently, the pre-stage driver of the master word line driver may be shared across different portions of the bank. When the memory device receives a command to access one or more rows of memory cells of a portion of the bank, the output of the pre-stage driver of the master word line driver may be routed to the target final stage driver of the main word line driver coupled to the portion of the bank. The target final stage driver may bias or activate a main word line corresponding to the row of memory cells. Additionally, the address driver may bias or activate an address line of the bank corresponding to the one or more rows of memory cells. As a result of biasing or activating the main word line and the address line, a word line corresponding to the row of memory cells to be accessed may be activated and the row of memory cells may be subsequently accessed.

In another example, the pre-stage driver of the main word line driver may be shared across different memory banks. In such example, each bank may have a corresponding address line driver. When the memory device receives a read command to access a row of memory cells at a portion of a bank, the output of the pre-stage driver of the main word line driver may be routed to the final stage driver of the main word line driver coupled with the bank. The final stage driver may bias or activate a main word line corresponding to the row of memory cells. Additionally, the address driver may bias or activate an address line of the bank corresponding to the row of memory cells. As a result of biasing or activating the main word line and the address line, a word line corresponding to the row of memory cells to be accessed may be activated and the row of memory cells may be subsequently accessed. By sharing main word line driver components between banks the overall size of the memory device may be decreased when compared to other memory device architectures.

Figure 2:
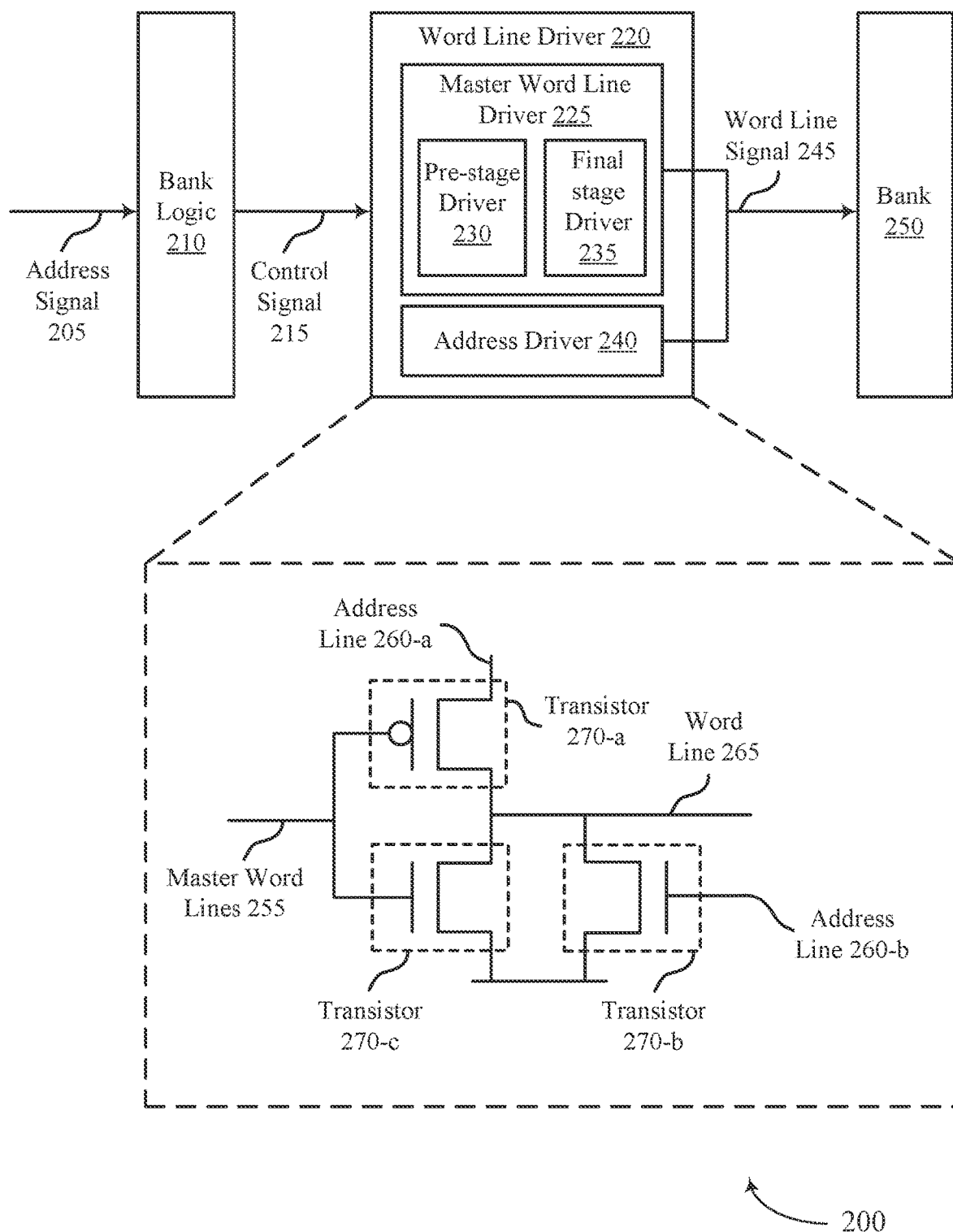
FIG. 2 illustrates an example of a component diagram that supports driver sharing between banks or portions of banks of memory devices in accordance with examples as disclosed herein.

FIG. 2 illustrates an example of a component diagram 200 that supports driver sharing between banks or portions of banks of memory devices in accordance with examples as disclosed herein. In some examples, the component diagram 200 may include a word line driver 220, which may be an example of a row decoder 120 or part of a row decoder 120 as described with reference to FIG. 1.

A memory device may include an array of memory cells that are configured to store one or more logic states. The array of memory cells may be divided into banks 250 and each bank 250 may include multiple portions. The portions of a bank 250 may include that same number of memory cells (e.g., same number of columns and rows) or a different number of memory cells (e.g., a different number of columns and rows). Only one portion of the bank 250 may be accessed at one time.

As one example, a bank 250 may be divided into a first portion and a second portion. To access a row of memory cells of the first portion of the bank 250, a host device may transmit a read command to the memory device, where the read command may indicate an address for the row of memory cells being accessed. The memory device may extract the row address and input the row address into bank logic 210. In some examples, the bank logic 210 may be shared between the first portion and the second portion of the bank 250. Bank logic 210 may be coupled to the word line driver 220 and may output a control signal 215 to the word line driver 220 based on the row address. If the row address is associated with first portion, the bank logic 210 may output control signal 215 to the word line driver 220 for the first portion.

The word line driver 220 may include a master word line driver 225 and an address driver 240. The master word line driver 225 may implement at least a pre-stage driver 230 and a final stage driver 235. In some examples, the master word line driver 225 may be shared between different portions of the bank 250. In such examples, each portion of the bank 250 may have a corresponding final stage driver 235 included in the master word line driver 225. That is, the master word line driver 225 may include a final stage driver 235 coupled to the first portion and a different final stage driver 235 coupled to the second portion. In such case, the pre-stage driver 230 may be shared between the first portion and the second portion. That is, word line driver 220 may include a pre-stage driver 230 that is coupled to either the final stage driver 235 of the first portion or the final stage driver 235 of the second portion. Additionally, the address driver 240 may include a pre-stage driver and a final stage driver (e.g., not shown in FIG. 2). The pre-stage driver and the final stage driver of the address driver 240 may be shared between portions of the bank 250 (e.g., the first portion and the second portion). In some examples, the address driver 240 may implement OR logic (e.g., an OR gate) to generate an address line signal across the all portions of the bank 250 (e.g., the first portion and the second portion).

As another example, the master word line driver 225 may be shared between different banks, such as a first bank and a second bank. In such examples, each bank 250 may have a corresponding final stage driver 235 included in the master word line driver 225. That is, the master word line driver 225 may include a final stage driver 235 coupled to a first bank 250 and a different final stage driver 235 coupled to a second bank 250. In such cases, the pre-stage driver 230 may be shared between the first bank 250 and the second bank 250. That is, master word line driver 225 may include a pre-stage driver 230 that is coupled to either the final stage driver 235 of the first bank 250 or the final stage driver 235 of the second bank 250.

During an access operation, the pre-stage driver 230 may receive the control signal 215 from the bank logic 210 and route the control signal 215 to one of the final stage drivers 235 (e.g., the final stage driver 235 of the first portion, the final stage driver 235 of the second portion, the final stage driver 235 of the first bank, or the final stage driver 235 of the second bank). For example, if the control signaling is for the first portion of the bank 250, the pre-stage driver 230 may couple with the final stage driver 235 of the first portion and decouple from the final stage driver 235 of the second portion. Upon receiving the control signal 215 from the pre-stage driver 230, the final state driver 235 along with the address driver 240 may output a word line signal 245 to the bank 250. That is, the final stage driver 235 and the address driver 240 may activate a word line 265 corresponding to the row of memory cells to be accessed.

The circuit illustrated in FIG. 2 may be an example of a portion of a circuit that supports the generation of the word line signal 245. The circuit may include master word line 255 coupled to a word line 265 and an address line 260-*a*. In some examples, the word line 265 may be an example of a target word line or a word line corresponding to the row address indicated in the command. Although FIG. 2 shows the master word line 255 coupled to a single address line 260 and a single word line 265, the master word line 255 may be coupled to multiple address lines 260-*a* and corresponding word lines 265. For example, a single master word line 255 may be coupled to eight different sets of address lines 260 and word lines 265. In addition, the circuit may include multiple electronic components such as transistors 270. Transistors 270 may be examples of PMOS transistors or NMOS transistors. The transistor 270-*a* may have one end coupled to the address line 260-*a*, the other end may be coupled to the word line 265, and a gate coupled to the master word line 255. The transistor 270-*c* may have one end coupled to ground, the other end coupled to the word line 265, and a gate coupled to the master word line 255. The transistor 270-*b* may have one end coupled to ground, the other end may be coupled to the word line 265, and a gate coupled to the address line 260-*b*. Address line 260-*a* and address line 260-*b* may be complementary address lines 260.

As described above, the final stage driver 235 may receive the control signal 215 for the first portion of the bank 250 from the pre-stage driver 230. Upon receiving the control signal 215, the final stage driver 235 may bias the master word line 255 to a first voltage. In addition, the address driver 240 may bias the address line 260-*a* to a second voltage. In some examples, the first voltage may be smaller than the second voltage. That is, the first voltage may be representative of a low state and the second voltage may be representative of a low state. In some examples, this difference in voltage of the master word line 255 and the address line 260-*a* may activate the word line 265. The methods as described herein may reduce the amount of circuitry included in the word line driver 220 when compared to other method which may reduce the overall size of the memory device.

Figure 3:
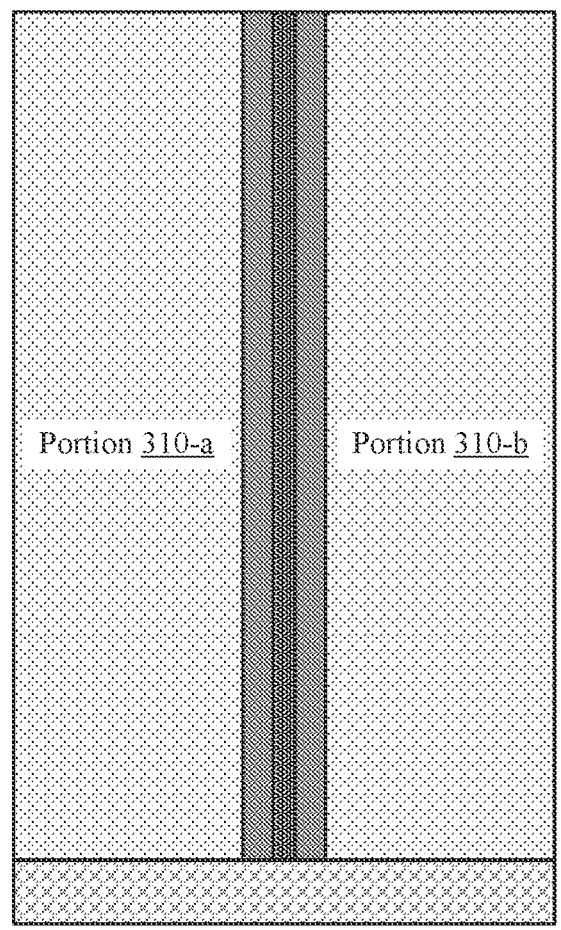
FIG. 3 illustrates an example of a memory device architecture that supports driver sharing between banks or portions of banks of memory devices in accordance with examples as disclosed herein.
Figure 3:
Figure 3:
Figure 3:
Figure 3:

FIG. 3 illustrates an example of a memory device architecture 300 that supports driver sharing between banks or portions of banks of memory devices in accordance with examples as disclosed herein. In some examples, the memory device architecture 300 may implement aspects of a component diagram 200. For example, the memory device architecture 300 may include a bank 305, a master word line driver 315, an address driver 320, and bank logic 325 which may be examples of a bank 250, a master word line driver 225, an address driver 240, and a bank logic 210 as described with reference to FIG. 2.

In some examples, a memory device may be separated into different layers. For example, the memory device may include at least a metal layer and a memory array layer. The memory array layer may include an array of memory cells and the metal layer may include drivers that drive signals (e.g., word line signals, digit line signals, etc.) to the memory array layer. In some examples, the metal layer may be located below or above the memory array layer. In some examples, the metal layer may be an example of a CMOS-under-array (CuA) layer. In other examples, the metal layer may be located at the same level as the memory array layer.

The array of memory cells may be described as a set of overlapping digit lines and word lines and a memory cell may be located at each intersection of a word line and a digit line. In some examples, the memory array may be divided into banks 305. The quantity of memory cells included in each bank 305 of the memory array may be pre-configured at the memory device. Further, each bank may be divided into different portions 310. For example, the bank 305 may be divided into a portion 310-*a* and a portion 310-*b*. Only one portion 310 may be accessed (e.g., written or read) at one time. In some examples, each portion 310 of bank 305 may include the same quantity of memory cells (e.g., same quantity of word lines and digit lines). In other examples, each portion 310 of bank 305 may include a different quantity of memory cells (e.g., different quantities of word lines and digit lines).

As described with reference to FIG. 2, one or more drivers or sub-components of drivers may be shared between portions 310. In one example, an address driver 320 may be shared between the portion 310-*a* and the portion 310-*b*. In such examples, the address driver 320 may be located between the portion 310-*a* and the portion 310-*b* in the metal layer. The address driver 320 may be coupled to a set of address lines, where each address line is coupled to a respective digit line of the portion 310-*a* and the portion 310-*b*. As such, the address driver may generate a signal to both the portion 310-*a* and the portion 310-*b* during an access operation or more specifically, the address driver may bias an address line coupled to a target digit line common to both the portion 310-*a* and the portion 310-*b* during an access operation.

Additionally, sub-components of a master word line driver 315 may be shared between the portion 310-*a* and the portion 310-*b*. In some examples, the master word line driver 315 may be located between the portion 310-*a* and the portion 310-*b* in the metal layer. The components that make up the master word line driver 315 may be a pre-stage driver and final-stage driver. In some examples, the pre-stage driver may be shared between the portion 310-*a* and the portion 310-*a* and the final stage driver may not be shared between the portion 310-*a* and the portion 310-*b*. That is, there may be a final stage driver for each portion 310. A first final stage driver may be coupled to a first set of master word lines, where each master word lines may be coupled to a subset of the set of word lines of the portion 310-*a* and a second final stage driver may be coupled to a second set of master word lines, where each master word line may be coupled to a subset of the set of digit lines of the portion 310-*b*. The pre-stage driver may be coupled to bank logic 325 as well as either one of the first final stage driver or a second final stage driver. During an access operation, the final stage driver may generate a signal to the portion 310-*a* or the portion 310-*b* or more specifically, the final stage driver may bias a master word line coupled to a target word line of the portion 310-*a* or the portion 310-*b*.

Moreover, the bank logic 325 may be shared between the portion 310-*a* and the portion 310-*b*. The bank logic 325 may be located to the side of the portion 310-*a* and the portion 310-*b* in the metal layer. During an access operation, the bank logic 325 may generate a control signal for the portion 310-*a* and control signal for the portion 310-*b* and select either the control signal for the portion 310-*a* or control signal for the portion 310-*b* to input into the pre-stage driver. The memory device architecture 300 may conserve space when compared to other memory device architectures.

Figure 4:
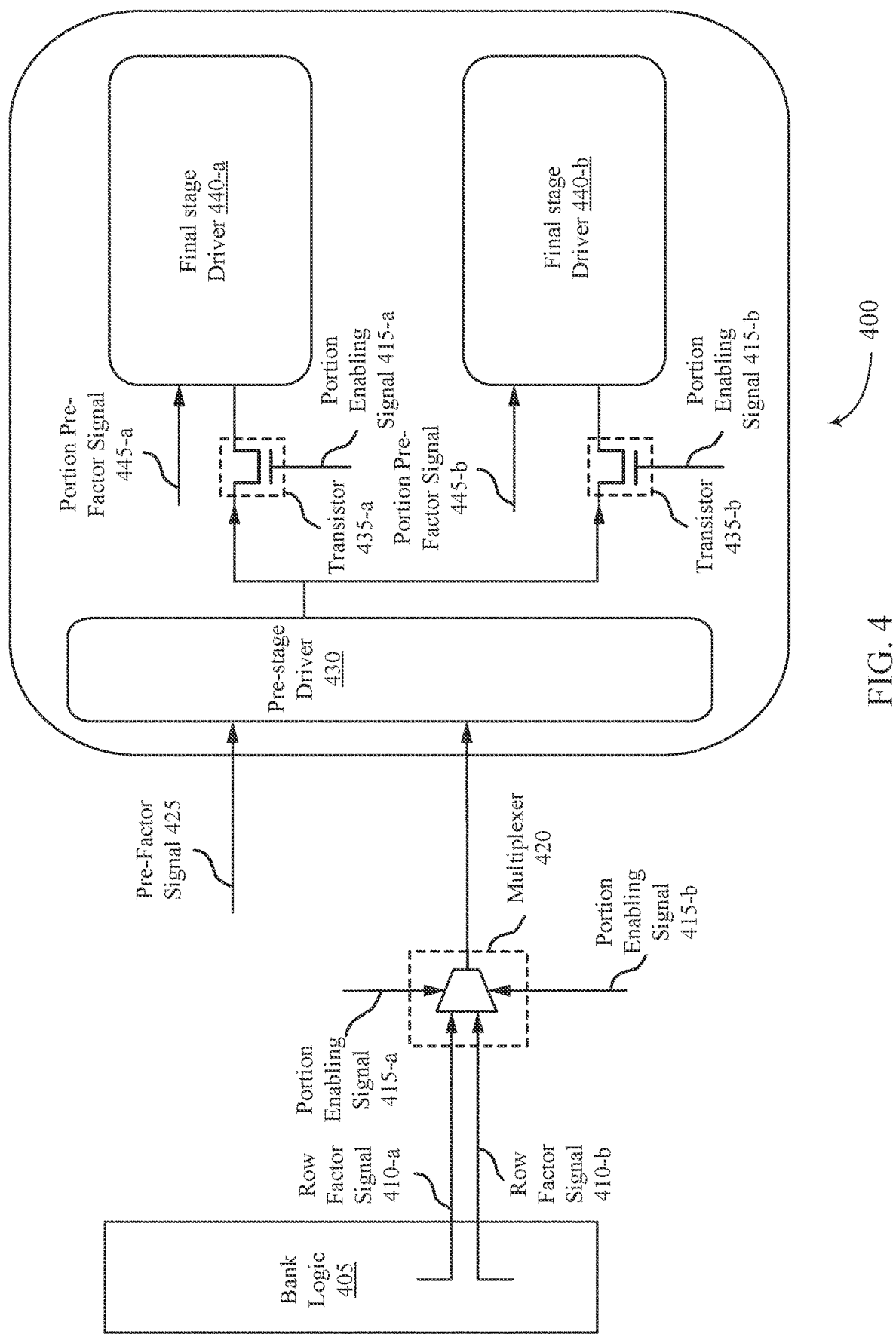
FIG. 4 illustrates an example of a component diagram that supports driver sharing between banks or portions of banks of memory devices in accordance with examples as disclosed herein.

FIG. 4 illustrates an example of a component diagram 400 that supports driver sharing between banks or portions of banks of memory devices in accordance with examples as disclosed herein. In some examples, the component diagram 400 may implement aspects of a component diagram 200. For example, the component diagram 400 may include bank logic 405, a pre-stage driver 430, and final stage drivers 440 which may be examples of bank logic 210, a pre-stage driver 230, and a final stage driver 235 as described with reference to FIG. 2.

As described with reference to FIG. 3, components of a main word line driver and bank logic 405 may be shared between portions of a bank. In some examples, the bank may be divided into a first portion and a second portion. A memory device may receive an access command from a host device to access memory cells of a portion of the bank. For example, the memory device may receive an access command to access memory cells of the first portion. To access memory cells of the first portion, the bank logic 405 may generate a row factor signal 410-*a* and a row factor signal 410-*b*. Row factor signal 410-*a* may correspond to a decoded row address that may relate to a main word line of the first portion and row factor signal 410-*b* may correspond to a decoded row address that may related to a main word line of the second portion.

In some examples, the bank logic 405 may input the row factor signal 410-*a* and the row factor signal 410-*b* into a multiplexer 420. The function of the multiplexer 420 may be to output one of the row factor signal 410-*a* or the row factor signal 410-*b* to the pre-stage driver 430. The multiplexer 420 may determine which of the row factor signals 410 to output based on a portion enabling signal 415. If the row address indicated in the access command corresponds to the first portion, the memory device may input the portion enabling signal 415-*a* into the multiplexer 420 and the multiplexer 420 may output the row factor signal 410-*a* to the pre-stage driver 430. If the row address indicated in the access command corresponds to the second portion, the memory device may input the portion enabling signal 415-b into the multiplexer 420 and the multiplexer 420 may output the row factor signal 410-b to the pre-stage driver 430. Along with the row factor signal 410, the pre-stage driver 430 may receive a pre-factor signal 425.

Between the pre-stage driver 430 and the final stage driver 440 may be a selection circuit (or a selection component). The function of the selection circuit may be to selectively couple the pre-stage driver 430 to a final stage driver 440 that corresponds to the target word line (e.g., couple the pre-stage driver 430 with one of the final stage driver 440-a or the final stage driver 440-b). The selection circuit may include a transistor 435-a and a transistor 435-b. For the transistor 435-a, one end may be coupled to the final stage driver 440-a, the other end may be coupled to the pre-stage driver 430, and the gate may be coupled to the portion enabling signal 415-a. For the transistor 435-b, one end may be coupled to the final stage driver 440-b, the other end may be coupled to the pre-stage driver 430, and the gate may be coupled to the portion enabling signal 415-a. If the access command indicates a row address corresponding to the first portion, the memory device may increase a voltage of the pre-factor signal 425, the portion pre-factor signal 445-a, and the portion enabling signal 415-a causing the transistor 435-a to activate thereby electrically coupling the pre-stage driver 430 with the final stage driver 440-a. This may allow the pre-stage driver 430 to route the row factor signal 410-a to the final stage driver 440-a. Upon receiving the row factor signal 410-a, the final stage driver 440-a may generate a master word line signal or activate a main word line corresponding to the row address indicated in the access command.

Alternatively, the access command may indicate a row address corresponding to the second portion. In such case, the memory device may increase a voltage of the pre-factor signal 425, the portion pre-factor signal 445-b, and the portion enabling signal 415-b causing the transistor 435-b to activate thereby electrically coupling the pre-stage driver 430 with the final stage driver 440-b. This may allow the pre-stage driver 430 to route the row factor signal 410-b to the final stage driver 440-b. Upon receiving the row factor signal 410-b, the final stage driver 440-b may generate a main word line signal or activate a main word line corresponding to the row address indicated in the access command.

Figure 5:
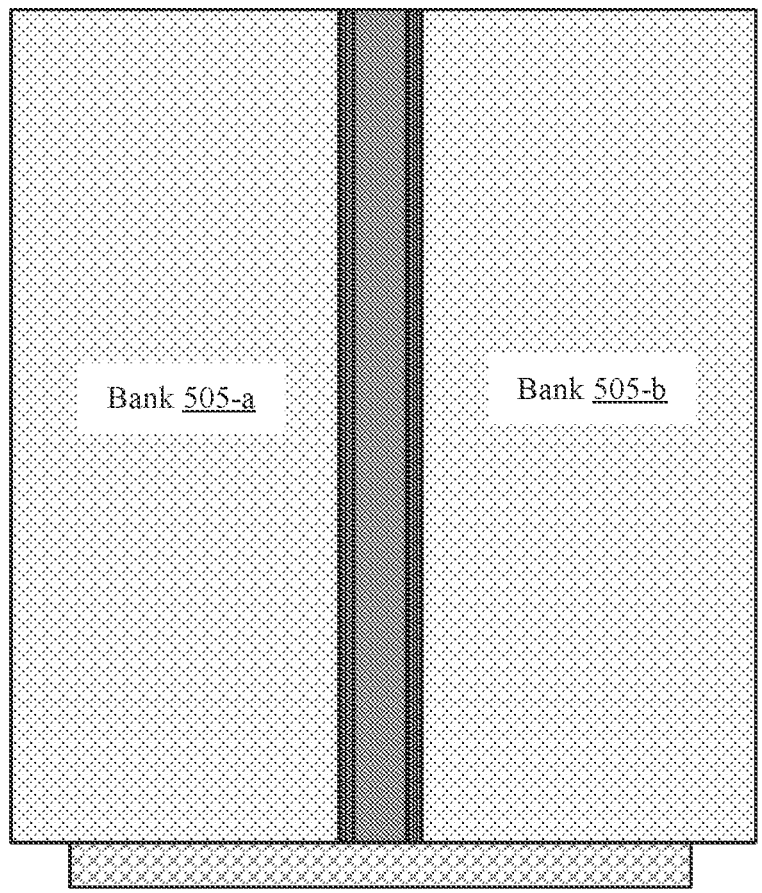
FIG. 5 illustrates an example of a memory device architecture that supports driver sharing between banks or portions of banks of memory devices in accordance with examples as disclosed herein.

FIG. 5 illustrates an example of a memory device architecture 500 that supports driver sharing between banks or portions of banks of memory devices in accordance with examples as disclosed herein. In some examples, the memory device architecture 500 may implement aspects of a component diagram 200. For example, the memory device architecture 500 may include a bank 505, a master word line driver 515, an address driver 520, and bank logic 525 which may be examples of a bank 250, a master word line driver 225, an address driver 240, and a bank logic 210 as described with reference to FIG. 2.

In some examples, a memory device may be separated into different layers. For example, the memory device may include at least a metal layer and a memory array layer. The memory array layer may include an array of memory cells and the metal layer may include drivers that drive signals (e.g., word line signals, digit line signals, etc.) to the memory array layer. In some examples, the metal layer may be located below or above the memory array layer. In some examples, the metal layer may be an example of a CuA layer. In other examples, the metal layer may be located at the same level as the memory array layer.

The array of memory cells may be described as a set of overlapping digit lines and word lines and a memory cell may be located at each intersection of a word line and a digit line. In some examples, the memory array may be divided into banks 505. For example, the memory array may be split into a bank 505-a and a bank 505-b. The quantity of memory cells included in each bank 505 of the memory array may be pre-configured at the memory device. Further, each bank may be divided into different portions. For example, the bank 505-a may be divided into a first portion and a second portion. Similarly, the bank 505-b may be divided into a third portion and fourth portion. Only one portion may be accessed (e.g., written or read) at one time, but different banks 505 may be accessed at the same time or during overlapping time intervals. In some examples, each portion of banks 505 may include the same quantity of memory cells (e.g., same quantity of word lines and digit lines). In other examples, each portion of banks 505 may include a different quantity of memory cells (e.g., different quantity of word lines and digit lines).

As described with reference to FIG. 2, one or more drivers or sub-components of drivers may be shared between banks 505. In one example, there may be a first address driver 520 for the bank 505-a and a second address driver for the bank 505-b. The first address drivers 320 and the second address driver 320 may be located between the bank 505-a and the bank 505-b in the metal layer. The first address driver 520 may be coupled to a set of address lines, where each address line is coupled to a respective digit line of the bank 505-a. The second address driver 520 may be coupled to a set of address line, where each address line is coupled to a respective digit line of the bank 505-b. The first address driver 520 may generate a signal across the first portion or the second portion during an access operation and the second address driver 520 may generate a signal across the third portion or the fourth portion during an access operation.

In some examples, sub-components of a master word line driver 515 may be shared between the bank 505-a and the bank 505-b. In some examples, the master word line driver 515 may be located between the 505-a and the bank 505-b in the metal layer. The components that make up the master word line driver 315 may be a pre-stage driver and final-stage driver. In some examples, the pre-stage driver may be shared between the bank 505-a and the bank 505-b and the final stage driver may not be shared between the bank 505-a and the bank 505-b. That is, there may be a final stage driver for each bank 505. A first final stage driver may be coupled to a first set of master word lines, where each master word lines may be coupled to a subset of the set of word lines of the bank 505-a and second final stage driver may be coupled to a second set of master word lines, where each master word line may be coupled to a subset of the set of digit lines of the bank 505-b. The pre-stage driver may be coupled to bank logic 525 as well as either one of the first final stage driver or a second final stage driver. During an access operation, the final stage driver may generate a signal to the bank 505-a or the bank 505-b or more specifically, the final stage driver may bias a master word line coupled to a target word line of the bank 505-a or the bank 505-b.

Moreover, the bank logic 525 may be shared between the bank 505-a and the bank 505-b. More specifically, row factor circuitry, TmFZ circuitry, and Caschain circuitry may be shared between the banks 505. The bank logic 525 may be located to the side of the bank 505-a and the bank 505-b in the metal layer. During an access operation, the bank logic 525 may generate a control signal for the bank 505-a and a control signal for the bank 505-b and select either the control signal for the bank 505-*a* or control signal for the bank 505-*b* to input into the pre-stage driver. In some examples, sharing the bank logic 525 may result in some empty space or open space on either side of the bank logic 525.

Figure 6:
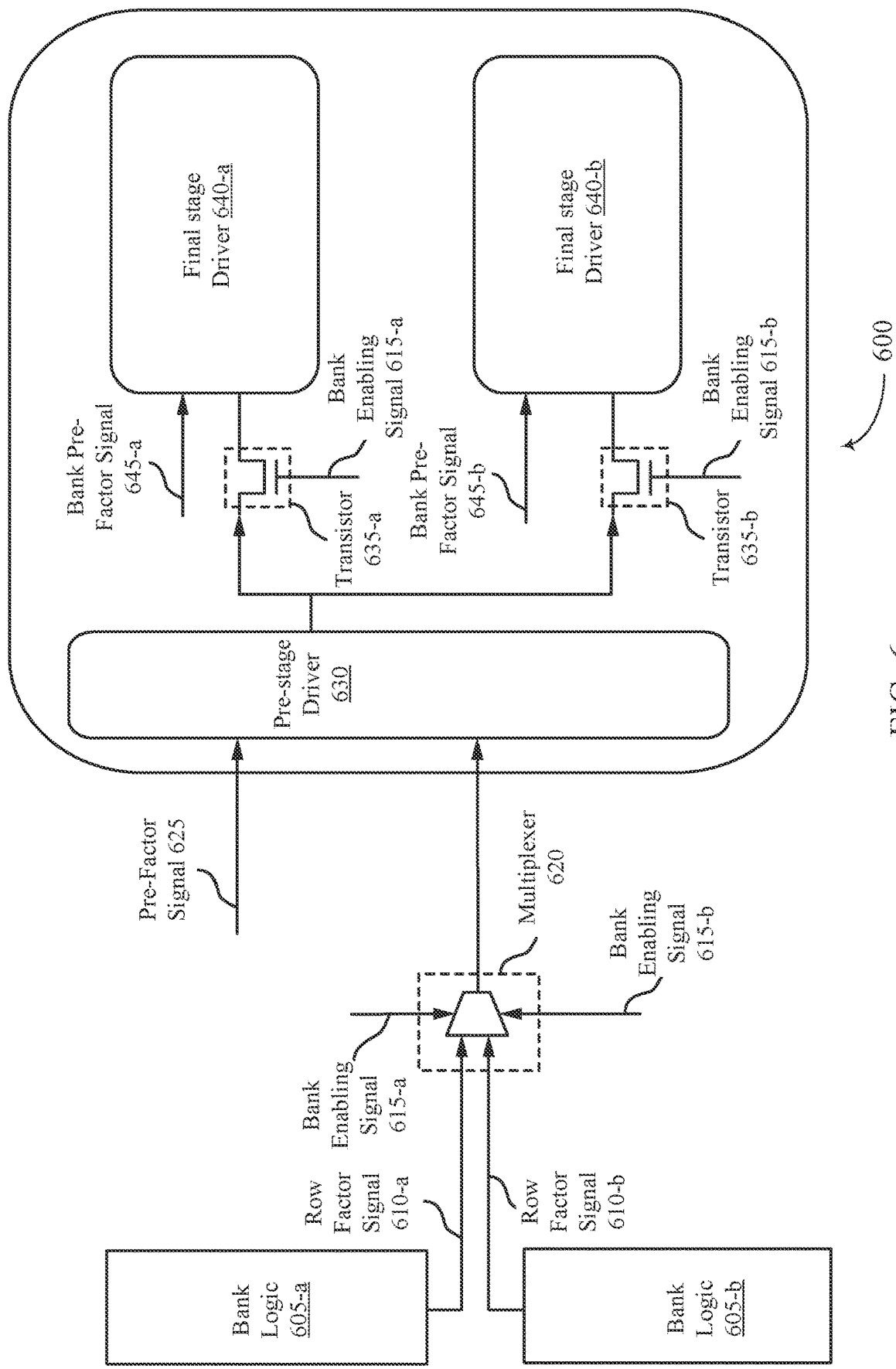
FIG. 6 illustrates an example of a component diagram that supports driver sharing between banks or portions of banks of memory devices in accordance with examples as disclosed herein.

FIG. 6 illustrates an example of a component diagram 600 that supports driver sharing between banks or portions of banks of memory devices in accordance with examples as disclosed herein. In some examples, the component diagram 600 may implement aspects of a component diagram 200. For example, the component diagram 600 may include bank logic 605, a pre-stage driver 630, and final stage drivers 640 which may be examples of bank logic 210, a pre-stage driver 230, and a final stage driver 235 as described with reference to FIG. 2.

As described with reference to FIG. 5, components of a main word line driver and bank logic 605 may be shared between banks. In one example, the memory device may include a first bank and a second bank. The first bank may be divided into a first portion and a second portion and the second bank may include a third portion and a fourth portion. A memory device may receive an access command from a host device to access memory cells of a portion of the bank. For example, the memory device may receive an access command to access memory cells of the first portion of the first bank. To access memory cells of the first portion, the bank logic 605-*a* may generate a row factor signal 610-*a* and the bank logic 605-*b* may generate a row factor signal 610-*b*. Row factor signal 610-*a* may correspond to a decoded row address that may relate to a main word line of the first portion or the second portion and the row factor signal 610-*b* may correspond to a decoded row address that may related to a main word line of the third portion or the fourth portion.

In some examples, the bank logic 605-*a* and the bank logic 605-*b* may input the row factor signal 610-*a* and the row factor signal 610-*b* into a multiplexer 620. The function of the multiplexer 620 may be to output one of the row factor signal 610-*a* or the row factor signal 610-*b* to the pre-stage driver 630. The multiplexer 620 may determine which of the row factor signals 610 to output based on a bank enabling signal 615. If the row address indicated in the access command corresponds to the first portion or the second portion, the memory device may input the bank enabling signal 615-*a* into the multiplexer 620 and the multiplexer 620 may output the row factor signal 610-*a* to the pre-stage driver 630. If the row address indicated in the access command corresponds to the third portion or the fourth portion, the memory device may input the bank enabling signal 615-*b* into the multiplexer 620 and the multiplexer 620 may output the row factor signal 610-*b* to the pre-stage driver 630. Along with the row factor signal 610, the pre-stage driver 630 may receive a pre-factor signal 625.

Between the pre-stage driver 630 and the final stage driver 640 may be a selection circuit. The function of the selection circuit may be to selectively couple the pre-stage driver 630 to one of the final stage driver 640-*a* or the final stage driver 640-*b*. The selection circuit may include a transistor 635-*a* and a transistor 635-*b*. For the transistor 635-*a*, one end may be coupled to the final stage driver 640-*a*, the other end may be coupled to the pre-stage driver 630 and the gate may be coupled to the bank enabling signal 615-*a*. For the transistor 635-*b*, one end may be coupled to the final stage driver 640-*b*, the other end may be coupled to the pre-stage driver 630, and the gate may be coupled to the bank enabling signal 615-*a*. If the access command indicates a row address corresponding to the first portion or the second portion, the memory device may increase a voltage of the pre-factor signal 625, the bank pre-factor signal 645-*a*, and the bank enabling signal 615-*a* causing the transistor 635-*a* to activate thereby electrically coupling the pre-stage driver 630 with the final stage driver 640-*a*. This may allow the pre-stage driver 630 to route the row factor signal 610-*a* to the final stage driver 640-*a*. Upon receiving the row factor signal 610-*a*, the final stage driver 640-*a* may generate a main word line signal or activate a main word line corresponding to the row address indicated in the access command.

Alternatively, the access command may indicate a row address corresponding to the second portion. In such cases, the memory device may increase a voltage of the pre-factor signal 625, the bank pre-factor signal 645-*b*, and the bank enabling signal 615-*b* causing the transistor 635-*b* to activate thereby electrically coupling the pre-stage driver 630 with the final stage driver 640-*b*. This may allow the pre-stage driver 630 to route the row factor signal 610-*b* to the final stage driver 640-*b*. Upon receiving the row factor signal 610-*b*, the final stage driver 640-*b* may generate a main word line signal and activate a main word line corresponding to the row address indicated in the access command.

Figure 7A:
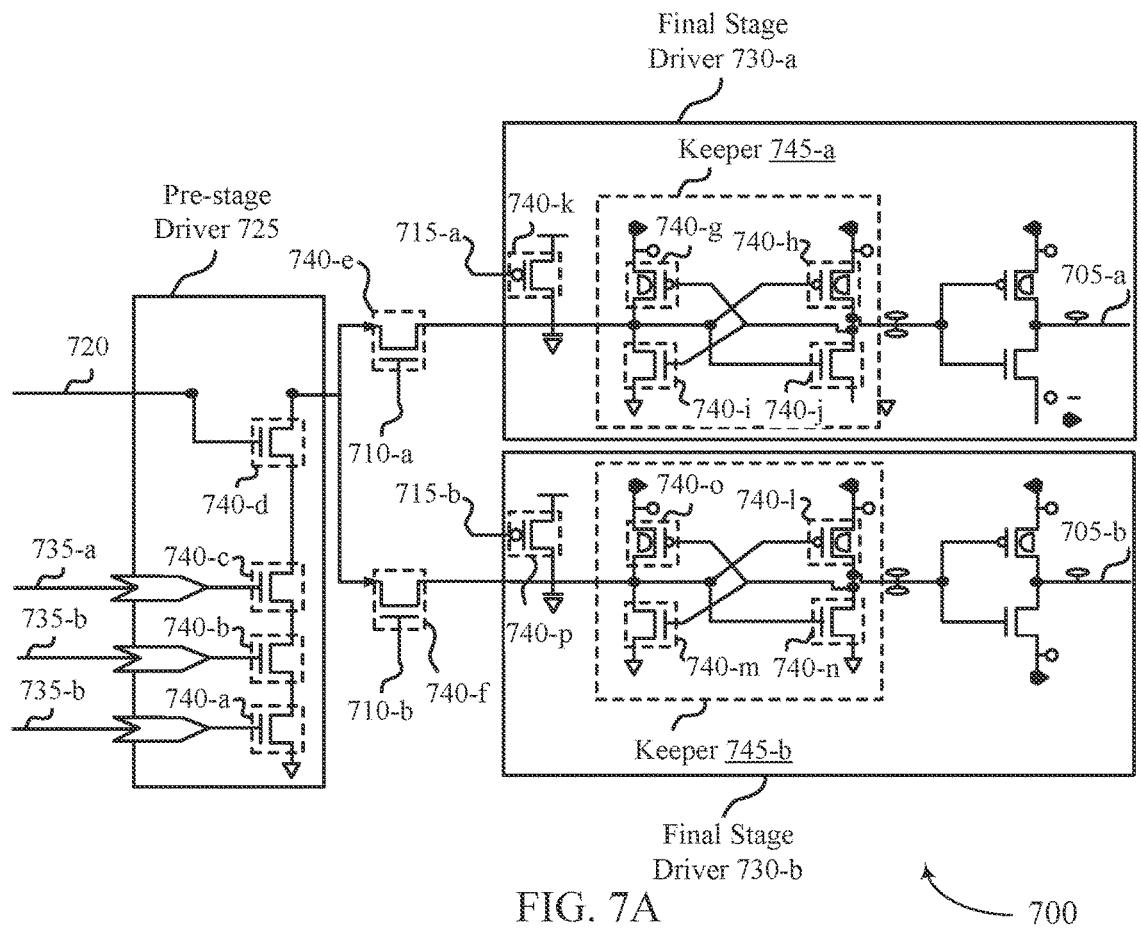
FIG. 7A illustrates an example of a circuit diagram that supports driver sharing between banks or portions of banks of memory devices in accordance with examples as disclosed herein.

FIG. 7A illustrates an example of a circuit diagram 700 that supports driver sharing between banks or portions of banks of memory devices in accordance with examples as disclosed herein. In some examples, the circuit diagram 700 may implement aspects of a component diagram 200. For example, the circuit diagram 700 may include a pre-stage driver 725 and final stage drivers 730 which may be examples of a pre-stage driver 230 and a final stage driver 235 as described with reference to FIG. 2.

Figure 7B:
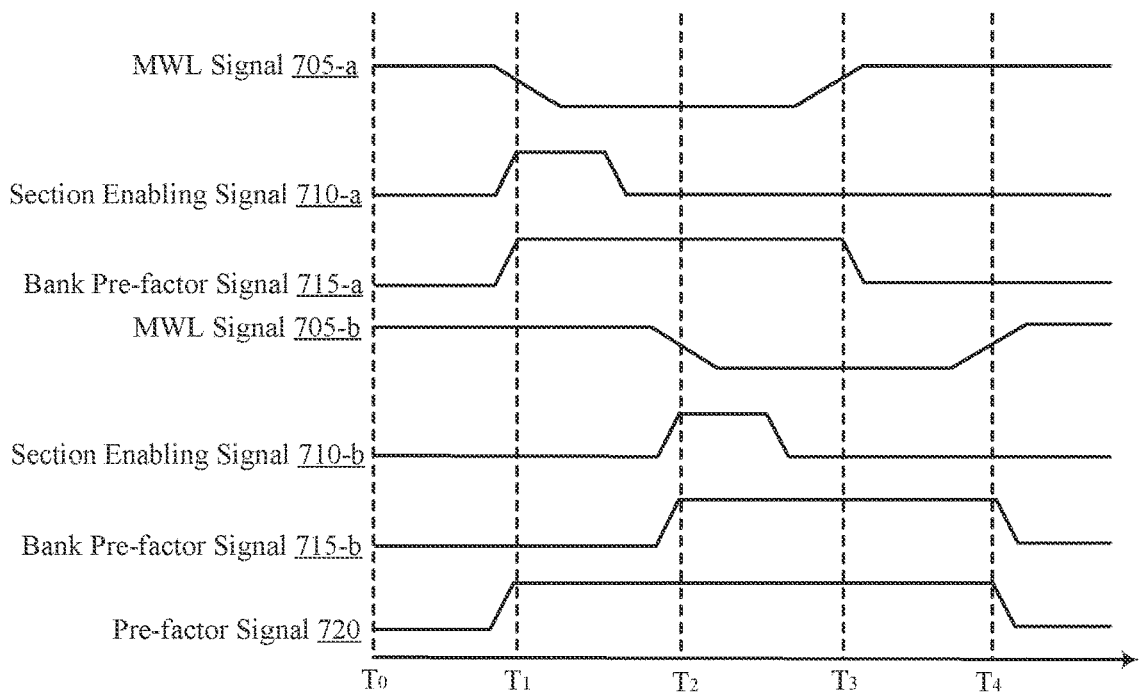
FIG. 7B illustrates an example of a timing diagram that supports driver sharing between banks or portions of banks of memory devices in accordance with examples as disclosed herein.

FIG. 7B illustrates an example of a timing diagram 701 that supports driver sharing between banks or portions of banks of memory devices in accordance with examples as disclosed herein. The timing diagram 701 may represent signals present at various locations in the circuit diagram 700.

In some examples, a memory array of a memory device may be divided into different banks and the bank may further be divided into different portions. For example, the memory array may include a first bank and a second bank. The first bank may include at least a first portion and a second portion and the second bank may include at least a third portion and a fourth portion. In some examples, the memory device may receive an access command to access a row of memory cells of either the first portion, the second portion, the third portion, or the fourth portion. In such example, the memory device may implement a main word line driver to activate a main word line corresponding to the row of memory cells.

The master line driver may include a pre-stage driver 725, a final stage drive 730-*a*, and a final stage driver 730-*b*. The pre-stage driver 725 may be coupled to bank logic, the final stage driver 730-*a* may be coupled to the first bank, and the final stage driver 730-*b* may be coupled to the second bank. The circuitry of the pre-stage driver may include a series of transistors 740. For example, the pre-stage driver may include a transistor 740-*a*, a transistor 740-*b*, a transistor 740-*c*, and a transistor 740-*d*. The gate of transistor 740-*a* may be coupled to an row factor signal 735-*a*, the gate of transistor 740-*b* may be coupled to a row factor signal 735-*b*, the gate of transistor 740-*c* may be coupled to a row factor signal 735-*c*, and the gate of transistor 740-*d* may be coupled to a pre-factor signal 720. The row factor signals 735 may be output from the bank logic and may be based on a row address indicated in the access command from the host device.

Between the pre-stage driver 725 and the final stage drivers 730 may be a selection component. The selection component may include a transistor 740-*e* and a transistor 740-*f*. One end of the transistor 740-*e* may be coupled to the pre-stage driver 725, another end of the transistor 740-*e* may be coupled to the final stage driver 730-*a*, and the gate of transistor 740-*e* may be coupled to a section enabling signal 710-*a*. Similarly, one end of the transistor 740-*f* may be coupled to the pre-stage driver 725, another end of the transistor 740-*f* may be coupled to the final stage driver 730-*b*, and the gate of transistor 740-*f* may be coupled to a section enabling signal 710-*e*.

Moreover, each of the final stage drivers 730 may include multiple transistors 740. For example, the final stage driver 730-*a* may include at least transistors 740-*g*, 740-*h*, 740-*i*, 740-*j*, and 740-*k* and the final stage driver 730-*b* may include at least transistors 740-1, 740-*m*, 740-*n*, 740-*o*, and 740-*p*. One end of the transistor 740-*k* may be coupled to a voltage source (e.g., Vccp) and the gate of the transistor 740-*k* may be coupled to a bank pre-factor signal 715-*a*. Transistors 740-*g* through 740-*j* may make up a keeper 745-*a*. One end of the transistor 740-*p* may be coupled to a voltage source (e.g., Vccp) and the gate of the transistor 740-*p* may be coupled to a bank pre-factor signal 715-*b*. Transistors 740-1 through 740-*o* may make up a keeper 745-*a*. Transistors 740 may be examples of PMOS transistors or NMOS transistors. Due to the addition of the transistor 740-*i* and the transistor 740-*m*, the keeper 745-*a* and the keeper 745-*b* may be configured to latch at high state and at low state.

The timing diagram 701 may illustrate the increase and decrease of signal voltages during one or more access operations. At T0, the first bank and the second bank may be in an inactive state. In an inactive state, the transistor 740-*g* of the first bank and the transistor 740-*k* of the second bank may be in pre-charged state and may be turned "on" or activated.

At T1, the memory device may receive an access command to access one or more rows of memory cells of the first portion or the second portion of the first bank. In response to the access command, the memory device may increase a voltage of the pre-factor signal 720, a voltage of the section enabling signal 710-*a* and a voltage of the bank pre-factor signal 715-*a*. Increasing the voltage of the section enabling signal 710-*a* may cause the transistor 740-*e* to turn "on" effectively coupling the pre-stage driver 725 to the final stage driver 730-*a*. Coupling the pre-stage driver 725 to the final stage driver 730-*a* may allow for the row factor signals 735 to be routed to the final stage driver 730-*a*. Increasing the voltage of the bank pre-factor signal 715-*a* may cause the transistor 740-*k* to turn "off" (or deactivated) causing the transistor 740-*a* to discharge to a ground voltage and the main word line signal 705-*a* to decrease in voltage or transition to an active state. From T1 to T3, the first bank may remain in an active state to perform the access operation on the first bank as indicated in the access command. At T3, the access operation may be complete and the voltage of bank pre-factor 715-*b* and the voltage of the section enabling signal 710-*b* may decrease and the voltage of the main word line signal 705-*d* may increase or transition to an inactive state.

In some examples, at T2, the memory device may receive a second access command to access a row memory cells of the third portion or the fourth portion of the second bank. When the memory device receives the second access command, the memory device may decrease the voltage of the section enabling signal 710-*a* which may turn "off" the transistor 740-*e* effectively decoupling the pre-stage driver 725 from the final stage driver 730-*a*. In some examples, the keeper 745-*a* may latch such that the first bank may remain active from T2 to T3. At T2, the memory device may also increase a voltage of the bank pre-factor signal 715-*b* and a voltage of the section enabling signal 710-*b* resulting in a decrease in a voltage of the main word line signal 705-*d* in a similar manner as described with reference to the final stage driver 730-*b* at T1. The second bank may stay active from T2 to T4. At T4, the access operation may be complete and the voltage of bank pre-factor 715-*b* and the voltage of the section enabling signal 710-*b* may decrease and the voltage of the main word line signal 705-*d* may increase or transition to an inactive state.

As described with reference to FIG. 2, the pre-stage driver 725 may be shared between two or more portions of a bank (not shown in FIG. 7A). For example, the pre-stage driver 725 may be shared between the first portion and the second portion. There may be final stage driver coupled to the first portion and a final stage driver coupled to the second portion. In such cases, in contrast to FIG. 7A, the final stage drivers may include keepers that do not include the transistor 740-*i*. That is, the keepers of the first portion and the second portion may include keepers configured to latch at a high state. The methods as described herein may provide for more efficient memory access operations and the memory device architecture described herein may conserve valuable die space when compared to other methods and memory device architectures.

Figure 8:
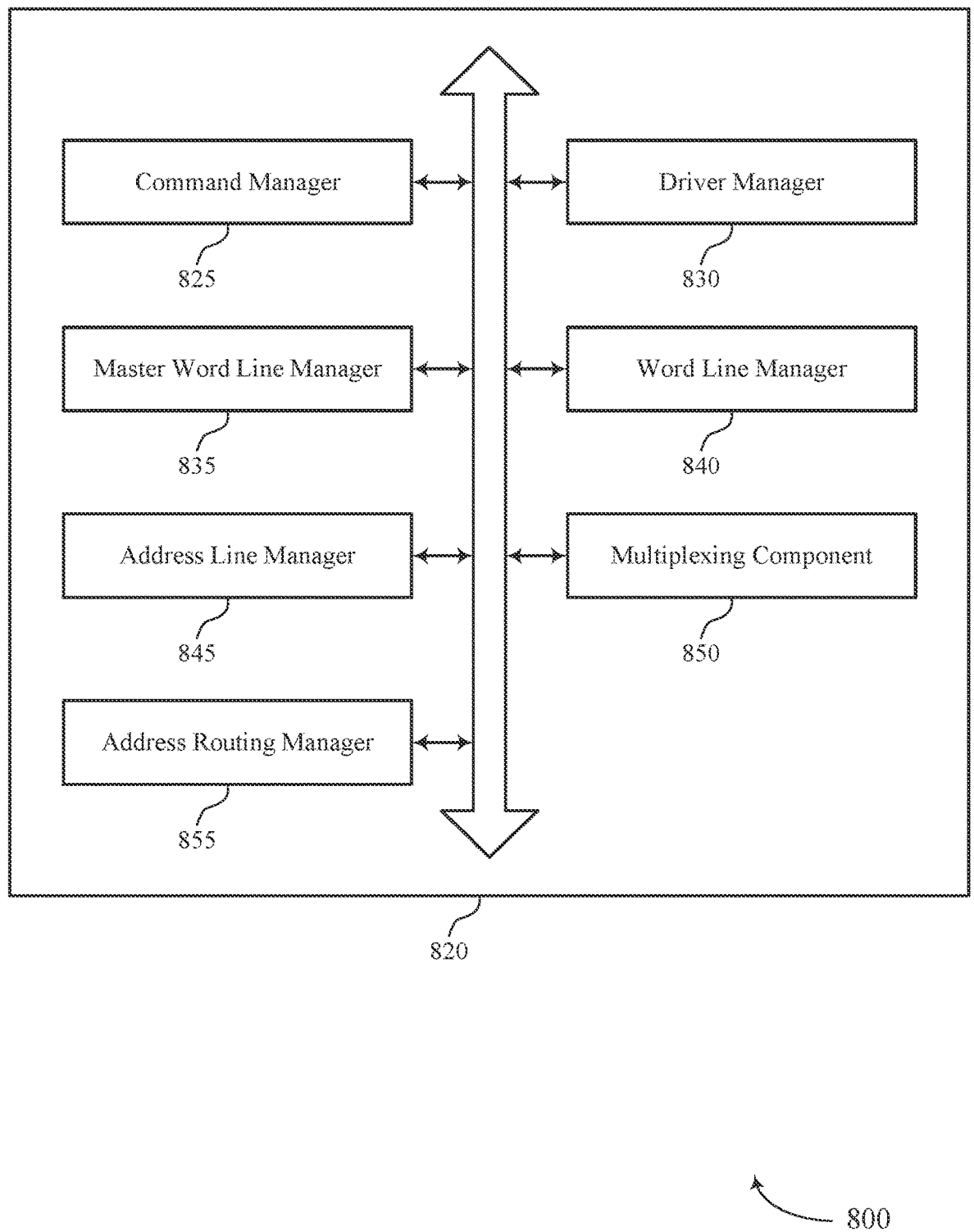
FIG. 8 shows a block diagram of a memory device that supports driver sharing between banks or portions of banks of memory devices in accordance with examples as disclosed herein.

FIG. 8 shows a block diagram 800 of a memory device 820 that supports driver sharing between banks or portions of banks of memory devices in accordance with examples as disclosed herein. The memory device 820 may be an example of aspects of a memory device as described with reference to FIGS. 1 through 7. The memory device 820, or various components thereof, may be an example of means for performing various aspects of driver sharing between banks or portions of banks of memory devices as described herein. For example, the memory device 820 may include a command manager 825, a driver manager 830, a master word line manager 835, a word line manager 840, an address line manager 845, a multiplexing component 850, an address routing manager 855, or any combination thereof. Each of these components may communicate, directly or indirectly, with one another (e.g., via one or more buses).

The command manager 825 may be configured as or otherwise support a means for receiving a command to access one or more memory cells of a bank of memory cells, where the bank of memory cells includes a first portion and a second portion. The driver manager 830 may be configured as or otherwise support a means for coupling a pre-stage driver of a master word line driver to a first final stage driver of the master word line driver that is associated with the first portion or a second final stage driver of the master word line driver that is associated with the second portion based at least in part on the command. The master word line manager 835 may be configured as or otherwise support a means for activating a master word line coupled with a set of word lines of the first portion or the set of word lines of the second portion to a first voltage based at least in part on the coupling the pre-stage driver to the first final stage driver or the second final stage driver. The word line manager 840 may be configured as or otherwise support a means for activating a word line of the set of word lines coupled with the one or more memory cells based at least in part on biasing the master word line.

In some examples, the address line manager 845 may be configured as or otherwise support a means for biasing, via an address driver, a row address line coupled with the word line to a second voltage greater than the first voltage, where activating the word line is based at least in part on biasing the row address line.

In some examples, the multiplexing component 850 may be configured as or otherwise support a means for inputting a first address signal associated with the first portion and a second address signal associated with the second portion into a bank logic circuit coupled with the pre-stage driver. In some examples, the multiplexing component 850 may be configured as or otherwise support a means for outputting, to the pre-stage driver, the first address signal associated with first portion or the second address signal associated with the second portion based at least in part on the command.

In some examples, the address routing manager 855 may be configured as or otherwise support a means for routing the first address signal associated with the first portion to the first final stage driver coupled with the first portion. In some examples, the address routing manager 855 may be configured as or otherwise support a means for routing the second address signal associated with the second portion to the second final stage driver coupled with the second portion, where activating the master word line is based at least in part on routing the first address signal associated with the first portion or routing the second address signal associated with the second portion.

In some examples, the driver manager 830 may be configured as or otherwise support a means for coupling the pre-stage driver with the first final stage driver or the second final stage driver based at least in part on an address indicated in the command.

Figure 9:
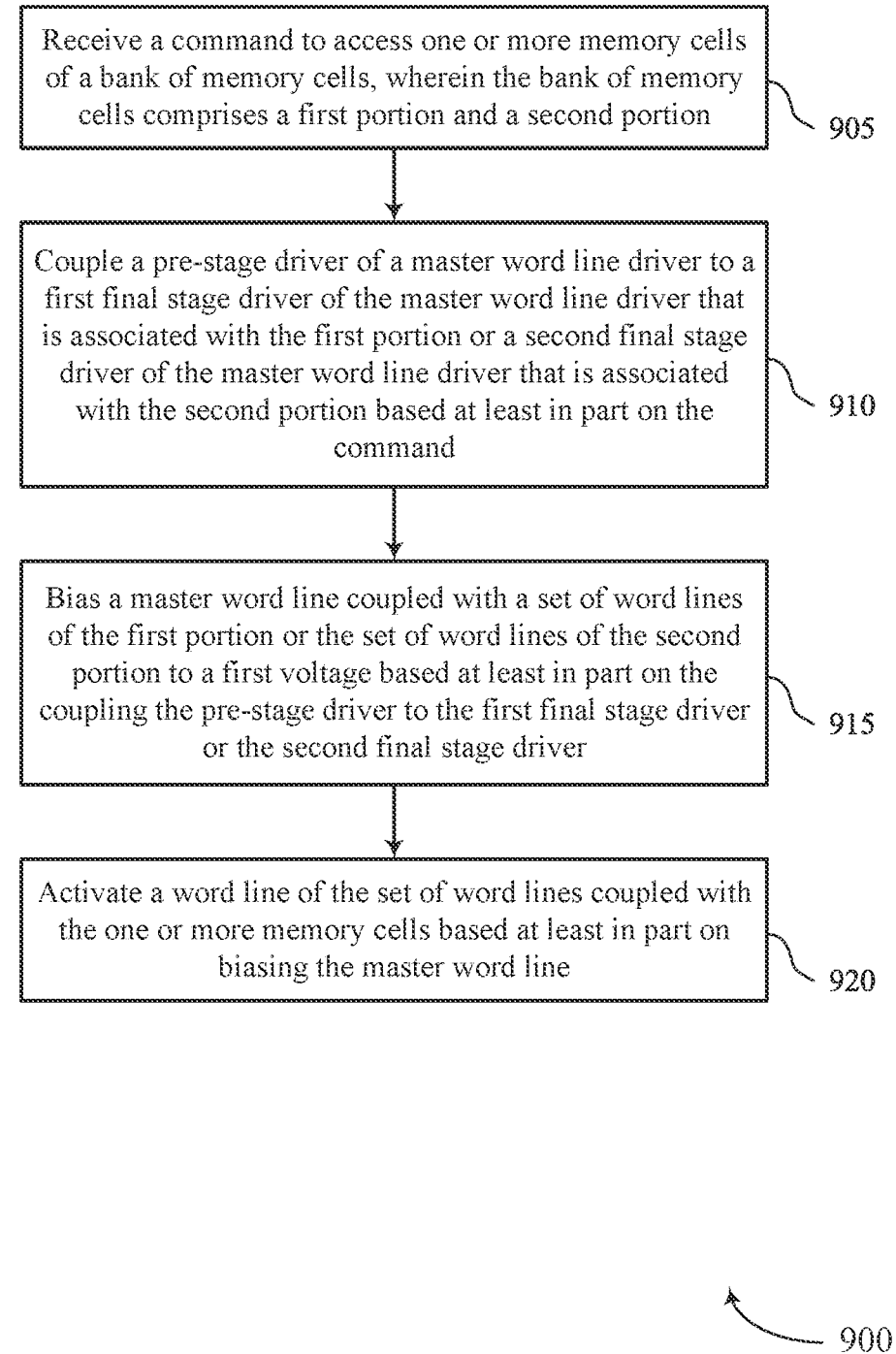
FIG. 9 shows a flowchart illustrating a method or methods that support driver sharing between banks or portions of banks of memory devices in accordance with examples as disclosed herein.

FIG. 9 shows a flowchart illustrating a method 900 that supports driver sharing between banks or portions of banks of memory devices in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include receiving a command to access one or more memory cells of a bank of memory cells, where the bank of memory cells includes a first portion and a second portion. The operations of 905 may be performed in accordance with examples as disclosed herein. In some examples, aspects of the operations of 905 may be performed by a command manager 825 as described with reference to FIG. 8.

At 910, the method may include coupling a pre-stage driver of a master word line driver to a first final stage driver of the master word line driver that is associated with the first portion or a second final stage driver of the master word line driver that is associated with the second portion based at least in part on the command. The operations of 910 may be performed in accordance with examples as disclosed herein. In some examples, aspects of the operations of 910 may be performed by a driver manager 830 as described with reference to FIG. 8.

At 915, the method may include activating a master word line coupled with a set of word lines of the first portion or the set of word lines of the second portion to a first voltage based at least in part on the coupling the pre-stage driver to the first final stage driver or the second final stage driver. The operations of 915 may be performed in accordance with examples as disclosed herein. In some examples, aspects of the operations of 915 may be performed by a master word line manager 835 as described with reference to FIG. 8.

At 920, the method may include activating a word line of the set of word lines coupled with the one or more memory cells based at least in part on activating the master word line. The operations of 920 may be performed in accordance with examples as disclosed herein. In some examples, aspects of the operations of 920 may be performed by a word line manager 840 as described with reference to FIG. 8.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving a command to access one or more memory cells of a bank of memory cells, where the bank of memory cells includes a first portion and a second portion, coupling a pre-stage driver of a master word line driver to a first final stage driver of the master word line driver that is associated with the first portion or a second final stage driver of the master word line driver that is associated with the second portion based at least in part on the command, activating a master word line coupled with a set of word lines of the first portion or the set of word lines of the second portion to a first voltage based at least in part on the coupling the pre-stage driver to the first final stage driver or the second final stage driver, and activating a word line of the set of word lines coupled with the one or more memory cells based at least in part on activating the master word line.

In some examples of the method 900 and the apparatus described herein, biasing, via an address driver, a row address line coupled with the word line to a second voltage greater than the first voltage, where activating the word line may be based at least in part on biasing the row address line.

Some examples of the method 900 and the apparatus described herein may further include operations, features, circuitry, logic, means, or instructions for inputting a first address signal associated with the first portion and a second address signal associated with the second portion into a bank logic circuit coupled with the pre-stage driver and outputting, to the pre-stage driver, the first address signal associated with first portion or the second address signal associated with the second portion based at least in part on the command.

Some examples of the method 900 and the apparatus described herein may further include operations, features, circuitry, logic, means, or instructions for routing the first address signal associated with the first portion to the first final stage driver coupled with the first portion and routing the second address signal associated with the second portion to the second final stage driver coupled with the second portion, where activating the master word line may be based at least in part on routing the first address signal associated with the first portion or routing the second address signal associated with the second portion.

Some examples of the method 900 and the apparatus described herein may further include operations, features, circuitry, logic, means, or instructions for coupling the pre-stage driver with the first final stage driver or the second final stage driver based at least in part on an address indicated in the command.

It should be noted that the methods described herein describe possible implementations, and that the operations and the steps may be rearranged or otherwise modified and that other implementations are possible. Further, portions from two or more of the methods may be combined.

An apparatus is described. The apparatus may include a bank of memory cells including a first portion and a second portion, a word line driver coupled with the bank of memory cells and configured to activate word lines of the bank of memory cells, the word line driver including, a master word line driver configured to generate a first signal to the first portion or the second portion of the bank as part of performing an access operation on the bank of memory cells, and an address driver configured to generate a second signal to both the first portion and the second portion of the bank as part of performing the access operation on the bank of memory cells, where a target word line is configured to be activated based at least in part on the master word line driver generating the first signal and the address driver generating the second signal.

In some examples, the apparatus may include a bank logic circuit associated with the bank of memory cells and coupled with the master word line driver, the bank logic circuit including and a multiplexer configured to output an address signal for the first portion or the second portion based at least in part on an address indicated in a command to access the bank of memory cells.

In some examples of the apparatus, the master word line driver includes a first final stage driver coupled with the first portion of the bank, a second final stage driver coupled with the second portion of the bank, and a pre-stage driver configured to route the address signal to the first final stage driver or the second final stage driver based at least in part on the output of the multiplexer.

In some examples, the apparatus may include a selection circuit coupled with the pre-stage driver, the first final stage driver, and the second final stage driver, the selection circuit configured to couple the pre-stage driver with the first final stage driver or the second final stage driver based at least in part on the address indicated in the command.

In some examples of the apparatus, the first final stage driver or the second final stage driver may be configured to bias a master word line to a first voltage during at least a portion that a row address line may be biased to a second voltage via the address driver, the master word line coupled with a set of word lines that includes the target word line and the row address line coupled with the target word line.

In some examples of the apparatus, the second voltage may be greater than the first voltage.

In some examples of the apparatus, the pre-stage driver may be shared between the first portion and the second portion.

In some examples of the apparatus, the bank logic circuit may be shared by the first portion and the second portion.

Another apparatus is described. The apparatus may include a first bank of memory cells including a first portion and a second portion, a second bank of memory cells including a third portion and a fourth portion, a word line driver coupled with the first bank of memory cells and the second bank of memory cells, the word line driver configured to activate first word lines of the first bank of memory cells or activate second word lines of the second bank of memory cells, the word line driver including, a master word line driver configured to generate a first signal for the first bank or the second bank as part of performing an access operation, and an address driver configured to generate a second signal to a portion of the first bank or the second bank as part of performing the access operation, where a target word line of the first bank or the second bank is configured to be activated based at least in part on the master word line driver generating the first signal and the address driver generating the second signal.

In some examples, the apparatus may include a bank logic circuit coupled with the master word line driver, the bank logic circuit including and a multiplexer configured to output an address signal for the first bank or the second bank based at least in part on an address indicated in a command to access the first bank or the second bank.

In some examples of the apparatus, the master word line driver includes a first final stage driver coupled with the first bank, a second final stage driver coupled with the second bank, and a pre-stage driver configured to route the address signal to the first final stage driver or to the second final stage driver based at least in part on the output of the multiplexer.

In some examples, the apparatus may include a selection circuit coupled with the pre-stage driver, the first final stage driver, and the second final stage driver, the selection circuit configured to couple the pre-stage driver with the first final stage driver or the second final stage driver based at least in part on the address indicated in the command.

In some examples of the apparatus, the first final stage driver or the second final stage driver may be configured to bias a master word line to a first voltage during at least a portion that a row address line coupled may be biased to a second voltage via the address driver, the master word line coupled with a set of word lines of the first bank or the second bank that includes the target word line and the row address line coupled with the target word line.

In some examples of the apparatus, the second voltage may be greater than the first voltage.

In some examples of the apparatus, the first final stage driver or the second final stage driver includes a latch circuit configured to latch at a high state when the pre-stage driver may be coupled with the first final stage driver or the second final stage driver and subsequently, at a low state when the pre-stage driver may be decoupled from the first final stage driver or the second final stage driver, respectively.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processing (DSP) and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry, or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a bank of memory cells comprising a first portion and a second portion; and
   a word line driver coupled with the bank of memory cells and configured to activate word lines of the bank of memory cells, the word line driver comprising:
      a master word line driver configured to generate a first signal to the first portion or the second portion of the bank as part of performing an access operation on the bank of memory cells; and
      an address driver coupled with a set of word lines that are common to both the first portion and the second portion and the address driver configured to generate a second signal to both the first portion and the second portion of the bank as part of performing the access operation on the bank of memory cells, wherein a target word line of the first portion or the second portion is configured to be activated based at least in part on the master word line driver generating the first signal and the address driver generating the second signal.

2. The apparatus of claim 1, further comprising:
   a bank logic circuit associated with the bank of memory cells and coupled with the master word line driver, the bank logic circuit comprising:
      a multiplexer configured to output an address signal for the first portion or the second portion based at least in part on an address indicated in a command to access the bank of memory cells.

3. The apparatus of claim 2, wherein the master word line driver comprises:
   a first final stage driver coupled with the first portion of the bank;
   a second final stage driver coupled with the second portion of the bank; and
   a pre-stage driver configured to route the address signal to the first final stage driver or the second final stage driver based at least in part on the output of the multiplexer.

4. The apparatus of claim 3, further comprising:
   a selection circuit coupled with the pre-stage driver, the first final stage driver, and the second final stage driver, the selection circuit configured to couple the pre-stage driver with the first final stage driver or the second final stage driver based at least in part on the address indicated in the command.

5. The apparatus of claim 3, wherein the first final stage driver or the second final stage driver is configured to bias a master word line to a first voltage during at least a portion that a row address line is biased to a second voltage via the address driver, the master word line coupled with the set of word lines that includes the target word line and the row address line coupled with the target word line.

6. The apparatus of claim 5, wherein the second voltage is greater than the first voltage.

7. The apparatus of claim 3, wherein the pre-stage driver is shared between the first portion and the second portion.

8. The apparatus of claim 2, wherein the bank logic circuit is shared by the first portion and the second portion.

9. An apparatus, comprising:
   a first bank of memory cells comprising a first portion and a second portion;
   a second bank of memory cells comprising a third portion and a fourth portion; and
   a word line driver coupled with the first bank of memory cells and the second bank of memory cells, the word line driver configured to activate first word lines of the first bank of memory cells or activate second word lines of the second bank of memory cells, the word line driver comprising:
      a master word line driver configured to generate a first signal for the first bank or the second bank as part of performing an access operation; and
      an address driver configured to generate a second signal to a portion of the first bank or the second bank as part of performing the access operation, wherein a target word line of the first bank or the second bank is configured to be activated based at least in part on the master word line driver generating the first signal and the address driver generating the second signal.

10. The apparatus of claim 9, further comprising:
    a bank logic circuit coupled with the master word line driver, the bank logic circuit comprising:
       a multiplexer configured to output an address signal for the first bank or the second bank based at least in part on an address indicated in a command to access the first bank or the second bank.

11. The apparatus of claim 10, wherein the master word line driver comprises:
    a first final stage driver coupled with the first bank;
    a second final stage driver coupled with the second bank; and
    a pre-stage driver configured to route the address signal to the first final stage driver or to the second final stage driver based at least in part on the output of the multiplexer.

12. The apparatus of claim 11, further comprising:
    a selection circuit coupled with the pre-stage driver, the first final stage driver, and the second final stage driver, the selection circuit configured to couple the pre-stage driver with the first final stage driver or the second final stage driver based at least in part on the address indicated in the command.

13. The apparatus of claim 11, wherein the first final stage driver or the second final stage driver is configured to bias a master word line to a first voltage during at least a portion that a row address line is biased to a second voltage via the address driver, the master word line coupled with a set of word lines of the first bank or the second bank that includes the target word line and the row address line coupled with the target word line.

14. The apparatus of claim 13, wherein the second voltage is greater than the first voltage.

15. The apparatus of claim 11, wherein the first final stage driver or the second final stage driver comprises:
a latch circuit configured to latch at a high state when the pre-stage driver is coupled with the first final stage driver or the second final stage driver and subsequently, at a low state when the pre-stage driver is decoupled from the first final stage driver or the second final stage driver, respectively.

16. A method, comprising:
receiving a command to access one or more memory cells of a bank of memory cells, wherein the bank of memory cells comprises a first portion and a second portion;
coupling a pre-stage driver of a master word line driver to a first final stage driver of the master word line driver that is associated with the first portion or a second final stage driver of the master word line driver that is associated with the second portion based at least in part on the command;
activating a master word line coupled with a set of word lines of the first portion or the set of word lines of the second portion to a first voltage based at least in part on the coupling the pre-stage driver to the first final stage driver or the second final stage driver; and
activating a word line of the set of word lines coupled with the one or more memory cells based at least in part on activating the master word line.

17. The method of claim 16, further comprising:
biasing, via an address driver, a row address line coupled with the word line to a second voltage greater than the first voltage, wherein activating the word line is based at least in part on biasing the row address line.

18. The method of claim 16, further comprising:
inputting a first address signal associated with the first portion and a second address signal associated with the second portion into a bank logic circuit coupled with the pre-stage driver; and
outputting, to the pre-stage driver, the first address signal associated with the first portion or the second address signal associated with the second portion based at least in part on the command.

19. The method of claim 18, further comprising:
routing the first address signal associated with the first portion to the first final stage driver coupled with the first portion; or
routing the second address signal associated with the second portion to the second final stage driver coupled with the second portion, wherein activating the master word line is based at least in part on routing the first address signal associated with the first portion or routing the second address signal associated with the second portion.

20. The method of claim 19, further comprising:
coupling the pre-stage driver with the first final stage driver or the second final stage driver based at least in part on an address indicated in the command.

* * * * *